(12) United States Patent
Betti-Berutto et al.

(10) Patent No.: US 10,075,207 B2
(45) Date of Patent: Sep. 11, 2018

(54) GAAS/SIGE-BICMOS-BASED TRANSCEIVER SYSTEM-IN-PACKAGE FOR E-BAND FREQUENCY APPLICATIONS

(71) Applicant: Integrated Device Technology, Inc., San Jose, CA (US)

(72) Inventors: Andrea Betti-Berutto, Menlo Park, CA (US); Sushil Kumar, San Ramon, CA (US); Shawn Parker, Santa Clara, CA (US); Jonathan L. Kennedy, Grass Valley, CA (US); Christopher Saint, Colfax, CA (US); Michael Shaw, Granite Bay, CA (US); James Little, Sacramento, CA (US); Jeff Illgner, Grass Valley, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/144,193

(22) Filed: May 2, 2016

(65) Prior Publication Data
US 2016/0323008 A1    Nov. 3, 2016

Related U.S. Application Data

(60) Provisional application No. 62/154,865, filed on Apr. 30, 2015.

(51) Int. Cl.
*H04B 1/38*     (2015.01)
*H04B 1/28*     (2006.01)
(Continued)

(52) U.S. Cl.
CPC ............. *H04B 1/40* (2013.01); *H01L 23/66* (2013.01); *H01L 25/16* (2013.01); *H03F 3/1935* (2013.01);
(Continued)

(58) Field of Classification Search
CPC . H04B 1/40; H03F 1/0205; H03F 3/19; H03F 3/21; H03F 3/187; H03F 3/195;
(Continued)

(56) References Cited

U.S. PATENT DOCUMENTS 6,072,994 A * 6/2000 Phillips ................ G01S 13/767
                                                           375/219
6,821,029 B1   11/2004 Grung et al.
(Continued)

OTHER PUBLICATIONS

PCT/SU2016/030387, International Search Report (PCT/ISA/220 and PCT/ISA/210) dated Aug. 8, 2016, enclosing Written Opinion of the International Searching Authority (PCT/ISA/237) (Eight (8) pages).

*Primary Examiner* — Quochien B Vuong
(74) *Attorney, Agent, or Firm* — Christopher P. Maiorana, PC

(57) ABSTRACT

An e-band transceiver includes a transmitter circuit and a receiver circuit. The transmitter circuit includes a surface mounted technology (SMT) module on which is mounted a silicon-germanium (SiGe) bipolar plus CMOS (BiCMOS) converter, a gallium arsenide (GaAs) pseudomorphic high-electron-mobility transistor (pHEMT) output amplifier coupled to the SiGe BiCMOS converter, and a microstrip/waveguide interface coupled to the GaAs pHEMT output amplifier. The receiver circuit of the e-band transceiver includes a receiver-side SMT module on which is mounted a receiver-side SiGe BiCMOS converter, a GaAs pHEMT low noise amplifier coupled to the receiver-side SiGe BiCMOS converter, and a receiver-side microstrip/waveguide interface coupled to the receiver-side GaAs pHEMT low noise amplifier.

11 Claims, 3 Drawing Sheets

(51) Int. Cl.

| | |
|---|---|
| *H04B 1/40* | (2015.01) |
| *H01L 25/16* | (2006.01) |
| *H01L 23/66* | (2006.01) |
| *H04B 1/04* | (2006.01) |
| *H04B 1/16* | (2006.01) |
| *H03F 3/193* | (2006.01) |
| *H04W 52/02* | (2009.01) |
| *H03F 3/21* | (2006.01) |
| *H01L 27/06* | (2006.01) |

(52) U.S. Cl.
CPC ............... *H03F 3/211* (2013.01); *H04B 1/04* (2013.01); *H04B 1/16* (2013.01); *H04W 52/0209* (2013.01); *H01L 27/0623* (2013.01); *H01L 2223/6627* (2013.01); *H03F 2200/294* (2013.01); *H03F 2200/405* (2013.01); *H03F 2200/451* (2013.01); *H04B 2001/0416* (2013.01); *Y02D 70/00* (2018.01)

(58) Field of Classification Search
CPC .......... H03F 3/213; H03F 3/245; H03F 3/347; H03F 2003/45013; H03F 2200/451; H01L 2924/10329
USPC .................................. 455/73, 77, 78, 83, 333
See application file for complete search history.

(56) References Cited

U.S. PATENT DOCUMENTS

| | | | |
|---|---|---|---|
| 7,120,427 B1* | 10/2006 | Adams .................. | H03F 1/0261 455/76 |
| 8,183,925 B2* | 5/2012 | Ohta ..................... | H03F 1/0266 330/285 |
| 9,008,212 B2* | 4/2015 | Lovberg .............. | H04L 27/2039 375/279 |
| 9,316,733 B2* | 4/2016 | Mohamadi ............. | G01S 13/89 |
| 2005/0170789 A1 | 8/2005 | Consolazio | |
| 2009/0197551 A1 | 8/2009 | Paraskake et al. | |
| 2014/0003000 A1* | 1/2014 | McPartlin .............. | H01L 29/732 361/728 |

* cited by examiner

GAAS/SIGE-BICMOS-BASED TRANSCEIVER SYSTEM-IN-PACKAGE FOR E-BAND FREQUENCY APPLICATIONS

CROSS REFERENCE TO RELATED APPLICATIONS

This application claims the benefit of U.S. Provisional Application No. 62/154,865, filed Apr. 30, 2015, the contents of which are incorporated herein by reference in their entirety.

FIELD OF THE INVENTION

The present invention relates generally to a transceiver capable of millimeter-wave e-band wireless communications, and more particularly to a novel GaAs/SiGe-BICMOS-based transceiver system-in-package (SiP) for e-band frequency applications.

BACKGROUND

The e-band frequency allocation consists of the two unchannelized bands of 71-76 GHz and 81-86 GHz. These frequencies offer a wireless communications solution where a point-to-point, line of sight, wireless high-speed communications link can be established between two transceivers. E-band frequencies are used for high capacity point-to-point wireless, enabling gigabit-speed transmission in the millimeter-wave bands which generally comprise frequencies above 40 GHz. There has been interest in utilizing the e-band portion of the electromagnetic spectrum because of the inherently wide bandwidth available in the e-band frequency range. However, in order to represent a viable option, millimeter-wave e-band applications require a high level of integration without substantially increasing cost over comparable applications at lower frequency bands.

There is an ever-increasing industry need to reduce the size and cost of chipsets, including e-band communication chipsets. This pressure has driven designers to develop e-band transceivers with higher levels of integration, and towards making e-band transceivers smaller, lighter, more power efficient, and less expensive.

Therefore, there is a need in the art for a transceiver capable of millimeter-wave e-band wireless communications which is both highly integrated and cost effective to produce.

SUMMARY OF THE INVENTION

According to one example of the present disclosure, an e-band transceiver comprising a transmitter circuit and a receiver circuit, where the transmitter circuit includes a surface mounted technology (SMT) module. The SMT module includes a silicon-germanium (SiGe) bipolar plus CMOS (BiCMOS) converter, a gallium arsenide (GaAs) pseudomorphic high-electron-mobility transistor (pHEMT) output amplifier coupled to the SiGe BiCMOS converter, and a microstrip/waveguide interface coupled to the GaAs pHEMT output amplifier.

Another aspect of the present disclosure is for the receiver circuit of the e-band transceiver to comprise a receiver-side SMT module that includes a receiver-side SiGe BiCMOS converter, a GaAs pHEMT low noise amplifier coupled to the receiver-side SiGe BiCMOS converter, and a receiver-side microstrip/waveguide interface coupled to the receiver-side GaAs pHEMT low noise amplifier.

Other objects, advantages and novel features of the present invention will become apparent from the following detailed description of one or more preferred embodiments when considered in conjunction with the accompanying drawings.

DETAILED DESCRIPTION OF EMBODIMENTS OF THE INVENTION

The present disclosure relates to a novel transceiver design for millimeter-wave applications. To that end, one aspect of the invention is to harness the benefits of silicon-germanium (SiGe) bipolar plus CMOS (BiCMOS) technology which has been found to allow, at millimeter-wave frequencies, a high level of integration of various functions and functionalities, and integration of a complementary metal-oxide semiconductor (CMOS) digital control interface, such as the I$^2$C (Inter Integrated Circuit Communications) or SPI (or Serial-Peripheral interface) protocols, with the addition of non-volatile memory to store calibration data.

At the same time, however, at millimeter wave frequencies SiGe BiCMOS technology is known to suffer from poor voltage breakdown and output power capability, poor linearity for both up- and down-converters, as well as poor noise figure.

However, the inventors have realized that the drawbacks of SiGe BiCMOS technology can be addressed by incorporating gallium arsenide (GaAs) pseudomorphic high-electron-mobility transistor (pHEMT) technology into the novel transceiver design. Specifically, GaAs pHEMT provides good output power capabilities, high linearity for up- and down-converters and good receiver noise figure, even up to millimeter-wave frequencies.

Still further, GaAs pHEMT technology is known not to have a high-level of integration due to size constraints and couplings in the substrate. Thus, still another aspect of the invention is to incorporate Surface Mounted Technology (SMT) with a waveguide interface in order to provide a low cost System-in-Package (SiP) assembly on a Printed Circuit Board (PCB) while beneficially avoiding high frequency interfaces. With both SiGe BICMOS and GaAs pHEMT technologies being integrated on a one single SiP using SMT, the limitations and drawbacks of the SiGe BICMOS and GaAs pHEMT technologies, respectively, can be addressed in a complementary fashion, while at the same time achieving a very compact form factor for e-band application transceivers.

Accordingly, the present invention is directed to the integration of a two-chip solution in a low cost SiP that utilizes an SMT package design for e-band applications on both the transmitter side and the receiver side, whereby both SiGe BICMOS and GaAs pHEMT technologies are integrated onto the SMT package in a complementary manner to unexpectedly achieve superior performance at millimeter-wave frequencies.

Figure 1:
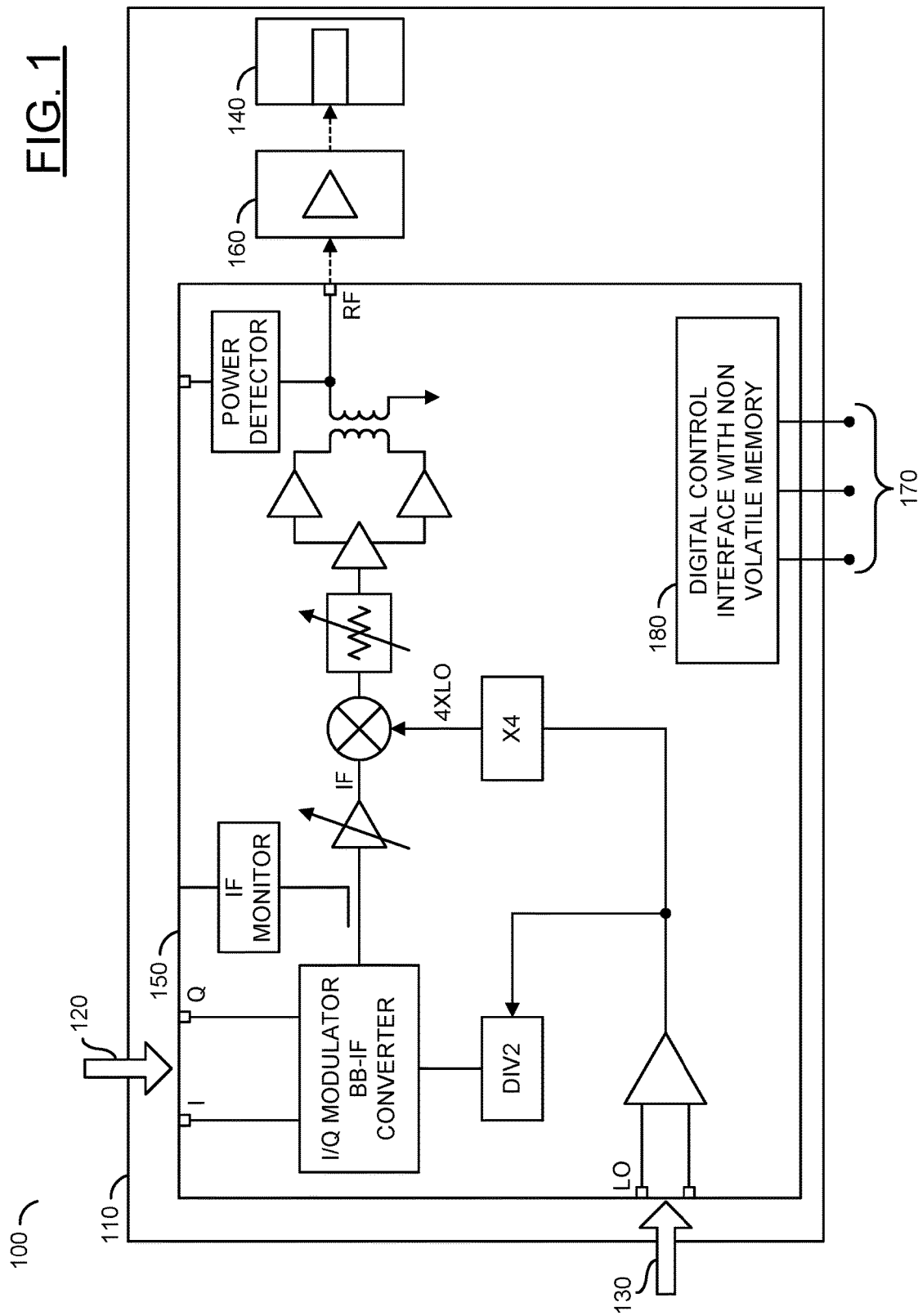
FIG. 1 illustrates one embodiment of a transmitter topology comprising a SMT SiP package configured in accordance with principles of the invention.

With reference now to FIG. 1, depicted is one embodiment of a transmitter topology 100 comprising a SMT SiP package 110 configured in accordance with principles of the invention.

The SMT package 110 of FIG. 1 corresponds to the transmitter side of a millimeter-wave e-band transceiver. The SMT interfaces of the package 110 are at low frequency, including the I and Q baseband inputs 120 and the local oscillator input 130. In addition, the millimeter-wave output of the transmitter is provided by a microstrip/waveguide interface 140 which may be configured to couple the output signal to an external waveguide (not shown).

The SMT package 110 is primarily comprised of a SiGe BICMOS converter chip 150 and a GaAs output amplifier 160. The SiGe BICMOS converter chip 150 may be preferably configured to provide the baseband amplification and channel filtering, IF and RF amplification and filtering, up- and down-conversion, gain controls and local oscillator multiplication circuits, in accordance with the topology for chip 150 shown in FIG. 1. It should further be appreciated that the topology of the SiGe BICMOS converter chip 150 may be either direct conversion (one single up- and down-conversion from BB to RF) or superetherodyne conversion (two up- and down-conversions, from Baseband to IF and from IF to RF)

Continuing to refer to FIG. 1, a digital interface 170 may be provided by the SiGe BICMOS converter chip 150, whereby digital control of bias, easy change of functionalities, such as type of channel filters and output power levels, may be readily provided to the SMT package 110. The digital interface 170 may be configured as an I²C or SPI interface.

Finally, the SMT package 110 of FIG. 1 may comprise a non-volatile memory 180, controlled by the digital interface 170, to provide storage capabilities for calibration data during the SiP production test, for example, thereby advantageously removing the burden of production calibration and tedious setting procedures from the customer. In particular, the calibration of the mixer bias for full rejection of local oscillator leakage, which can change from chip-to-chip, can be stored in the memory 180 inside the SMT package 110 itself during the package production test phase. As such, the end user will not need to employ a calibration rejection procedure. Furthermore, all baseband filters can be tuned, on a chip-by-chip basis, using parameters stored in the memory 180 in order to compensate process variations. Additional calibration parameters can also be stored in the memory 180 during production test to compensate for process variations of the GaAs output amplifier chip 160.

Finally, the GaAs output amplifier 160 of FIG. 1, which is preferably based on GaAs pHEMT technology, is configured to provide higher power levels and higher linearity on the transmitter side.

Figure 2:
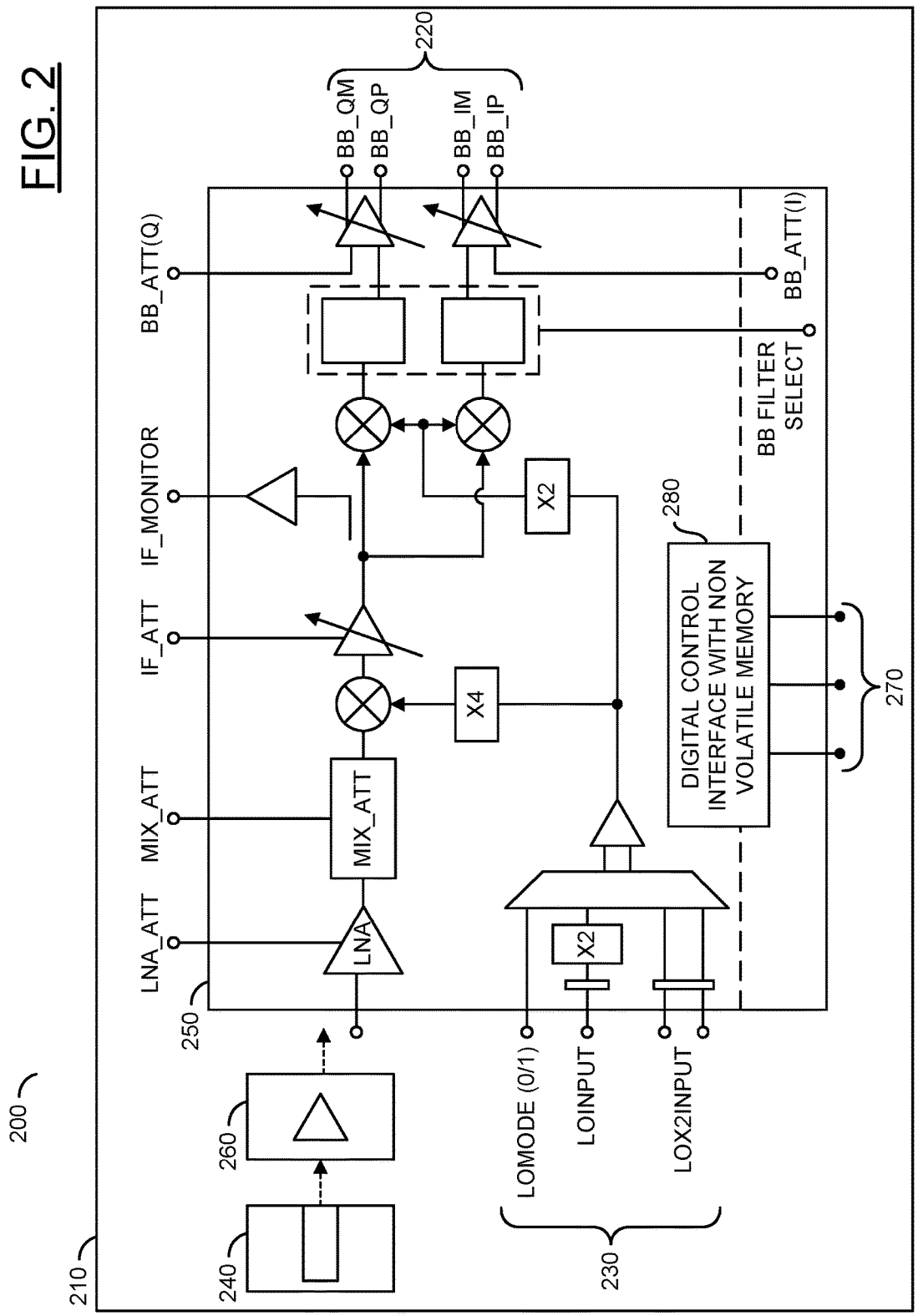
FIG. 2 illustrates one embodiment of a receiver topology comprising a SMT SiP package configured in accordance with principles of the invention.

While FIG. 1 depicted one embodiment of a transmitter topology 100 comprising a SMT SiP package 110 configured in accordance with principles of the invention, FIG. 2 depicts a receiver topology 200 which is configured in accordance with the principles of the invention. Specifically, the SMT package 210 of FIG. 2 corresponds to the receiver side of a millimeter-wave e-band transceiver.

The SMT interfaces of the package 210 of FIG. 2 are configured at a correspondingly low frequency, including the I and Q baseband outputs 220 and the local oscillator input 230. In addition, the millimeter-wave input of the receiver is provided by a microstrip/waveguide interface 240.

As with the transmitter SMT package 110, the receiver SMT package 210 is primarily comprised of a SiGe BICMOS converter chip 250, while the corresponding GaAs chip in the receiver is a GaAs low noise amplifier 260. The SiGe BICMOS converter chip 250 may be preferably configured to provide the baseband amplification and channel filtering, IF and RF amplification and filtering, up- and down-conversion, gain controls and local oscillator multiplication circuits, in accordance with the topology shown in FIG. 1. And, as with the transmitter side of the disclosed transceiver, it should equally be appreciated that the topology of the SiGe BICMOS converter chip 250 may be either direct conversion or superetherodyne conversion.

The SiGe BICMOS converter chip 250 of FIG. 2 may also include a digital interface 270 to provide for digital control of bias, easy change of functionalities, such as type of channel filters and output power levels.

Finally, the SMT package 210 of FIG. 2 may also comprise a non-volatile memory 280, controlled by the digital interface 270, to provide similar storage capabilities, functionalities and benefits as described above with reference to the memory 280 of the transmitter topology of FIG. 1.

The GaAs low noise amplifier 260 of FIG. 2, which is preferably based on GaAs pHEMT technology, is configured to provide low noise and higher linearity on the receiver side.

Figure 3:
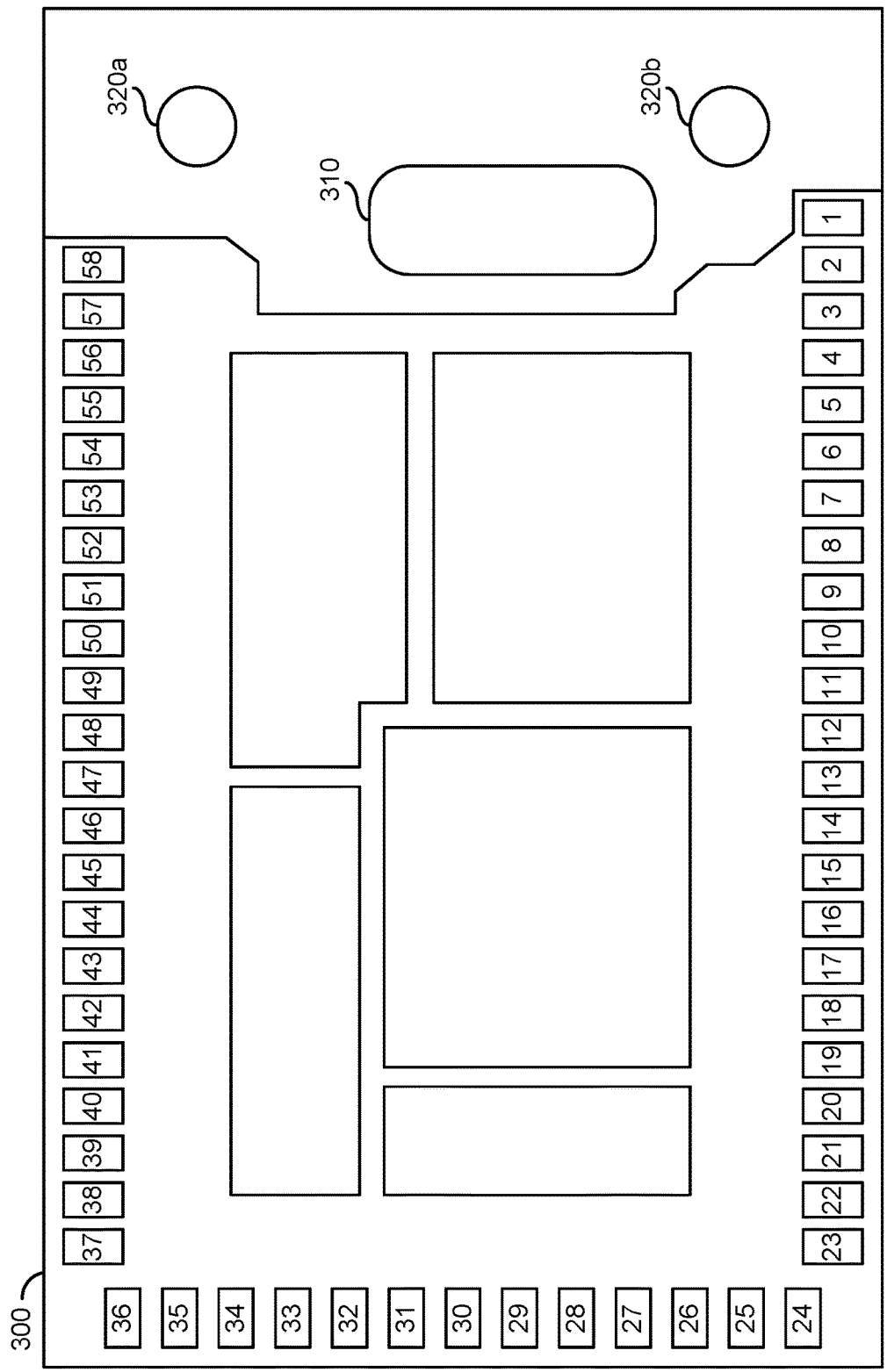
FIG. 3 illustrates one embodiment of a printed circuit board arrangement usable to implement the topologies of FIGS. 1 and 2.

With reference now to FIG. 3, depicted is one example of a PCB 300 on which the above SMT packages 110 and 210 may be implemented. In certain embodiments, PCB 300 may be a multilayer PCB using, for example, FR-4 for the bottom layer to provide robustness to the package, while a high frequency dielectric may be used as the top layer to allow low loss routing of RF signals and low loss at the microstrip/waveguide interface 310. The PCB on which the SMT packages 110 and 120 are implemented may be compatible with the standard board reflow process with standard low frequency feedthrough for direct current, baseband and local oscillator inputs using any number of the depicted pins 1-58. In order to allow proper alignment of the waveguide interface 310 on the bottom of the package, two dowel pins 320a and 320b may be used at the edges of the waveguide interface 320, as shown in FIG. 3. Of course, it should be appreciated that other known PCB configurations could be used in accordance with the principles of the invention.

Thus, in accordance with the above disclosure, the present invention provides a novel two-chip solution in a single low cost SiP that utilizes an SMT package design for e-band applications on both the transmitter side and the receiver side, whereby both SiGe BICMOS and GaAs pHEMT technologies are integrated onto the SMT package in a complementary manner to unexpectedly achieve superior performance at millimeter-wave frequencies.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof. Although the disclosure use terminology and acronyms that may not be familiar to the layperson, those skilled in the art will be familiar with the terminology and acronyms used herein.

What is claimed is:

1. An e-band transceiver comprising a transmitter circuit and a receiver circuit, wherein the transmitter circuit comprises:
    a surface mounted technology (SMT) module including:
        a silicon-germanium (SiGe) bipolar plus CMOS (BiCMOS) converter, a gallium arsenide (GaAs) pseudomorphic high-electron-mobility transistor (pHEMT) output amplifier coupled to the SiGe BiCMOS converter, and a microstrip/waveguide interface coupled to the GaAs pHEMT output amplifier; and
        a non-volatile memory configured to store calibration data, wherein said calibration data (i) allows a chip by chip calibration and (ii) avoids a calibration rejection procedure.

2. The e-band transceiver of claim 1, wherein the SiGe BiCMOS converter further comprises a digital interface.

3. The e-band transceiver of claim 2, wherein the digital interface is configured as a digital control interface for controlling one of bias, type of channel filters and output power levels of the SMT module.

4. The e-band transceiver of claim 3, wherein the digital control interface is configured as one of an I²C or SPI interface.

5. The e-band transceiver of claim 2, wherein the digital interface is coupled to a non-volatile memory.

6. The e-band transceiver of claim 1, wherein the SMT module is a system-in-package chip.

7. The e-band transceiver of claim 1, wherein the receiver circuit comprises:
    a receiver-side SMT module including:
        a receiver-side SiGe BiCMOS converter, a GaAs pHEMT low noise amplifier coupled to the receiver-side SiGe BiCMOS converter, and a receiver-side microstrip/waveguide interface coupled to the receiver-side GaAs pHEMT low noise amplifier.

8. The e-band transceiver according to claim 1, wherein said calibration comprises accounting for mixer bias for full rejection of local oscillator leakage.

9. The e-band transceiver according to claim 1, wherein said calibration is performed during a package production test phase.

10. The e-band transceiver according to claim 1, wherein said calibration compensates for process variations of the GaAs output amplifier.

11. The apparatus according to claim 1, wherein said amplifier is configured to provide higher power levels and higher linearity on a transmitter side.

* * * * *